United States Patent [19]

Abumehdi

[11] Patent Number: 4,933,706
[45] Date of Patent: Jun. 12, 1990

[54] FRANKING MACHINE

[75] Inventor: Cyrus Abumehdi, Harlow, United Kingdom

[73] Assignee: Alcatel Business Systems Limited, Romford, United Kingdom

[21] Appl. No.: 354,838

[22] Filed: May 22, 1989

[51] Int. Cl.$^5$ .................... G03B 27/32; G03B 27/52
[52] U.S. Cl. .................................................. 355/27
[58] Field of Search ................ 355/27; 364/464.2; 156/353, 361

[56] References Cited

U.S. PATENT DOCUMENTS

| | | | |
|---|---|---|---|
| 3,695,755 | 10/1972 | Egnaczak | 355/27 X |
| 4,039,258 | 8/1977 | Hujer | 355/27 |
| 4,073,588 | 2/1978 | Zangenfeind et al. | 355/50 X |
| 4,455,100 | 6/1984 | Bauer | 355/27 X |
| 4,720,733 | 1/1988 | Ohtake et al. | 355/50 |
| 4,840,696 | 6/1989 | Krasuski et al. | 156/353 |
| 4,886,566 | 12/1989 | Peyre | 156/361 |

Primary Examiner—Richard A. Wintercorn
Attorney, Agent, or Firm—Shoemaker and Mattare, Ltd.

[57] ABSTRACT

A franking machine is disclosed in which printing of a franking impression is effected by exposing a layer of micro-capsules containing ink to light to thereby cause hardening of the exposed micro-capsules and then subjecting the layer to pressure to rupture the un-exposed micro-capsules in the presence of a developer with which the ink reacts to become visible. The layer of micro-capsules may be coated on envelopes or label tape during manufacture or by coating means in the franking machine. The developer may be applied as a coating in a similar manner. Alternatively one or both the micro-capsules and the developer may be carried on a transfer film brought into contact under pressure with a mail item after exposure of the film.

18 Claims, 2 Drawing Sheets

FRANKING MACHINE

BACKGROUND OF THE INVENTION

This invention relates to franking machines and in particular to a method and apparatus for printing a franking impression on mail items such as envelopes and labels for attachment to larger items.

Mail items are franked by a franking machine which is arranged to print a franking impression on the mail items to indicate that a postal value has been charged for the transmission of that item. With small mail items comprising an envelope, the franking impression is usually applied directly to the envelope. However with larger items such as parcels and packets, too large to pass through the printing device of the franking machine, the franking impression cannot be applied directly to the item and instead is applied to a label which is subsequently adhered to the parcel or packet.

Franking machines include a printing device to print the franking impression and other material, such as an advertising slogan, may also be printed on the envelope or label by the printing device during the passage of the envelope or label through the franking machine. The printing has usually been effected by means of type characters which engage an inked roller and then the surface of the mail item or alternatively press an inked ribbon against the surface of the mail item. The franking impression comprises a pattern determined by the postal authority and includes the value of postage and the date of franking. The franking impression may include further data such as an identifier for the franking machine and coded data for checking the validity of the franking. Commonly the printer has a printing drum which is rotated to bring type carried by it into engagement with an inked roller and thereafter into printing engagement with a mail item. The drum may carry fixed type to print invariable data such as the officially authorised fixed pattern of the franking impression together with type characters which can be selected for the printing of the variable data such as the date and value of postage charged. The type characters for printing variable data are usually carried on rotatable type wheels which can be turned to bring selected characters into an operative printing position. Such printers require complex mechanisms for setting the type wheels and also electromechanical transducers for generating electrical signals, representing the postal value to which the type wheels are set, to provide electrical signals for input to electronic circuits of the postal value selected to be printed to enable the circuits to carry out accounting functions related to the use of the franking machine.

It has also been proposed to use other forms of printer such as thermal dot matrix printers which use a thermal transfer process for the transfer of ink from a transfer ribbon to the surface of the mail item. Such printers have a print head with a plurality of selectively heatable print elements which bear against a rear face of the transfer ribbon. The front face of the ribbon has a layer of inked material and the mail item is fed with its surface in contact with the front face of the ribbon. The layer of inked material of the ribbon is melted selectively by heating of the heatable elements of the print head. As a result the ink in the vicinity of the heated elements is transferred to the surface of a mail item contacting the ribbon. Thermal dot matrix printers have an advantage over the mechanical printers used in earlier franking machines in that they are electrically operated and hence do not require the provision of complex mechanical assemblies for setting mechanical printing devices to the values required to be printed. Furthermore because the postage value printed by the thermal dot matrix print head is determined directly by print drive signals originating from the accounting and control circuits there is no requirement to provide mechanical to electrical transducers to input electrical signals from the printer to the electronic circuits. However both forms of printer require the provision of an inked roller or inked ribbon. In use, ink is removed from the inked roller and after a relatively large number of passes of the type past the printing position the ink remaining in the roller is reduced to a level at which the printing would be too feint to be acceptable. Similarly, with thermal transfer ribbons, the ink is removed from the ribbon by the heated printing elements and, if the ribbon is a single strike ribbon, the ribbon is not able to be re-used. If a multi-strike ribbon is used, the ink will be reduced to a level at which the printing is unacceptable after a relatively small number of passes of the ribbon. Accordingly at intervals during the use of a franking machine it becomes necessary to interrupt use of the machine in order to replace the used ink roller or ribbon with a correspondingly fully charged roller or ribbon. Such interruptions are inconvenient to the user of the machine particularly if it should occur during a run of franking operations.

SUMMARY OF THE INVENTION

According to one aspect of the invention a franking system comprises the combination of a substrate having an area of a face thereof coated with material comprising micro capsules of fluid ink, said ink being changeable from a fluid state to a hard state by exposure to light of predetermined wavelength; and a franking machine including a printing device selectively operable to print a franking impression on a mail item by exposing selected portions of the coating on the face of the substrate to light of said predetermined wavelength and then bringing the exposed coating into contact under pressure with the mail item and into contact with a developer to cause un-exposed micro capsules containing fluid ink to release the fluid ink contained therein to react with the developer and change the visual appearance of the released ink to thereby produce a franking impression on said mail item.

According to a second aspect of the invention a franking system comprises the combination of a mail item such as an envelope or label having an area on a face thereof treated with material comprising micro capsules of fluid ink and a developer for said ink, said ink being changeable from a fluid state to a hard state by exposure to light of predetermined wavelength; and a franking machine including a printing device selectively operable to print a franking impression on said face of the mail item by exposing selected portions of the area on the face of the mail item to light of said predetermined wavelength and then treating the mail item in such manner as to cause only the un-exposed micro capsules containing fluid ink to release the ink to react with said developer and thereby change the visual state of the exposed portions of the area.

According to a third aspect of the invention a franking machine includes a printing device comprising elements selectively operable to expose selected portions of an area of a film, coated with material comprising micro-capsules containing ink in a fluid state, to light of predetermined wavelength to cause the ink to harden and remain hard; and means to bring said exposed coating on the film into contact under pressure with a mail item treated with developer whereby the unexposed micro-capsules containing ink in a fluid state rupture and release said into to react with the developer and produce a franking impression on the mail item.

According to another aspect of the invention a franking machine includes a printing device comprising elements selectively operable to expose selected portions of an area of the face of a mail item treated with sensitive material to light of predetermined wavelength whereby subsequent treatment of the sensitive material is effective to produce a colour differential between the exposed selected portions and the remainder of the area treated with sensitive material.

According to a further aspect of the invention a mail item such as an envelope or label has an area on a face thereof treated with material comprising micro capsules of fluid ink and a developer for said ink, said ink being changeable from a fluid state to a solid state by exposure to light of predetermined wavelength.

BRIEF DESCRIPTION OF THE DRAWING

Embodiments of the invention will now be described in more detail by way of example with reference to the drawings in which.

DESCRIPTION OF THE PREFERRED EMBODIMENT

Figure 1:
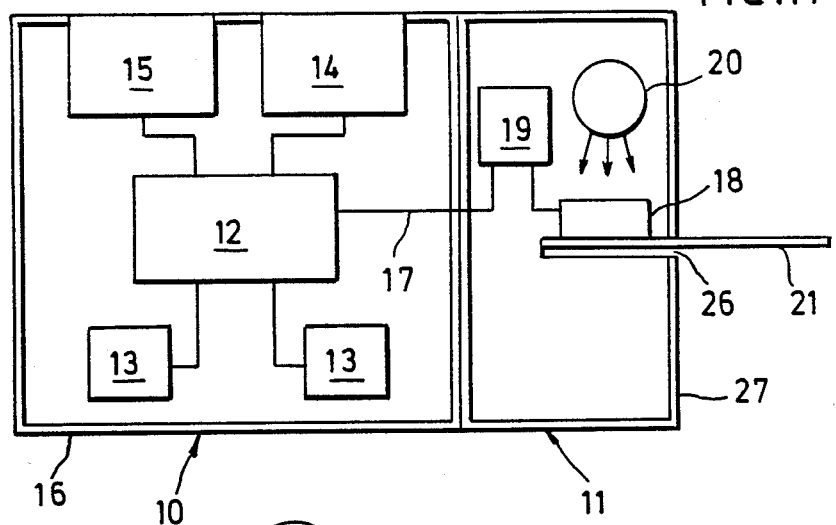
FIG. 1 illustrates diagrammatically the functional components of a franking machine.

Referring first to FIG. 1, a franking machine comprises an accounting and control unit 10 and a printing unit 11. The accounting and control unit 10 includes a microprocessor 12 for carrying out accounting and control functions, two memories 13 for storing data relating to the usage of the franking machine in franking mail items, a keyboard 14 to enable a user of the machine to input command signals to the microprocessor and to input required postal values for franking and a display device 15 to display machine status information to the user of the machine. The display also displays data such as the postal value when keyed in by the user to enable the user to check that the value keyed in corresponds to that desired by the user. Each memory 13 contains a plurality of storage locations providing a number of registers. One register, a descending register, stores the value of credit remaining available for use in franking, another register, an ascending register, stores the accumulated value of postage used by the machine, and a further register, a tote register, stores a count of the number of mail items franked by the machine. The registers are duplicated in each memory so that the two memories provide four replications of each register. By replicating the registers in this manner, the accounting data can be retrieved in the event of any corruption of the data stored in any register due to a fault arising in the electronic circuits. In order to ensure that the machine cannot be used in a fraudulent manner, the microprocessor and memories are contained within a secure housing 16 to prevent unauthorised access to any part of the machine concerned with the accounting functions. The construction and operation of such accounting and control circuits are well known in the franking machine art and therefore it is believed to be unnecessary for an understanding of the invention to describe these circuits in more detail.

Figure 2:
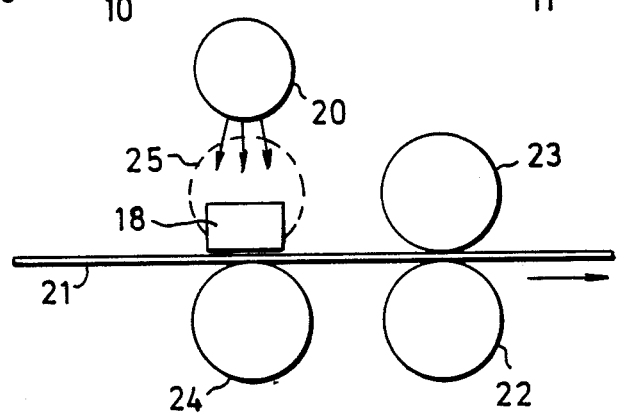
FIG. 2 illustrates an electro photographic print device used in the franking machine.

The printing unit 11 receives print control signals over lines 17 and includes a print head 18 controlled by a driver circuit 19. The printing head comprises an array of elements having a transmissivity to light which can be controlled by the application of electrical drive signals to the elements. The print head may be a head formed of material having a chemical composition which is a complex oxide of lead, lanthium, zirconium and titanium and known as a PLZT head or alternatively the head may utilise liquid crystal devices. However the latter devices have a slower operating speed than the PLZT head. The printing head is positioned intermediate a light source 20 and a feed path for mail items 21. The elements of the printing head act as selectively operated shutters controlling light from the source 20 reaching the surface of the mail items 21. The mail items, envelopes or labels, are formed of paper coated with light sensitive material. As the mail items 21 pass the print head 18, the elements of the print head are selectively driven to permit light from the source 20 to fall upon selected areas of the sensitised material and thereby to react with those areas of the material. The preferred form of coating of sensitised material consists of a developer layer overlaid by micro-capsules containing ink. In their normal state, the micro capsules are not perceptable and hence their presence is not apparent to the naked eye. The ink in the micro capsules consists of a photo sensitive polymer which hardens under the influence of light of the appropriate wavelength. Once the ink in the micro capsules has been hardened by light, the capsules become and remain solid. Thus, it will be appreciated that, as the mail item is fed past the print head and the elements of the head are selectively driven by electrical signals to selectively pass light from the source to the surface of the mail item, the micro capsules in selected areas of the coating on the mail item are exposed to the light from source 20 and become hardened and solid. After passing the print head 18, the mail item 21 is fed between a feed roller 22 and a pressure roller 23 (FIG. 2) resiliently urged toward the feed roller 22 so that the mail item is subjected to pressure. This pressure is of sufficient magnitude to be effective to cause those micro capsules which have not been acted upon by the light from source 20, and thus have not been hardened, to release the ink contained therein. The released ink is then able to react with the underlying layer of developer. This reaction causes the ink to change to a visible colour. Micro capsules in those areas which have been exposed to light from the source 20, and therefore have been hardened, will not release the ink and hence these areas will remain unchanged in colour. Thus the exposed areas will be unchanged while the remaining areas will be of the colour of the ink from the micro capsules after reaction with the developer.

The elements of the print head 18 may be arranged as a row of dots extending transversely of the direction of feed of the mail items. The elements are driven selectively by electrical signals successively in synchronism with the feeding of the mail item by a feed roller 24 and pressure rollers 25 so that the required pattern is built up row by row as the mail item is fed. Alternatively a larger number of elements may be provided arranged as an array in which selected ones of the elements are driven to form a complete print impression. The exposure of the mail item may be effected with the mail item on the move or if desired with the mail item stationery. Instead of dots, the print elements may comprise segments of or complete characters or patterns. It will be appreciated that the micro-capsules are hardened by the action of light. Thus instead of using devices acting as selectively operable shutters to control light from a source to expose the micro-capsules, the micro-capsules may be exposed to light from selectively energised light emissive devices such as LEDs or may be exposed by a scanned laser beam.

The feed path for the mail items 21 extends as a slot 26 in the printer housing 27. The print head 18 and light source 20 are located in the upper part of the housing and the envelopes or labels are fed through the slot 26 to be printed on their upper faces. The feed rollers 24, 22 are driven with equal peripheral speeds by an electric drive motor (not shown).

Figure 5:
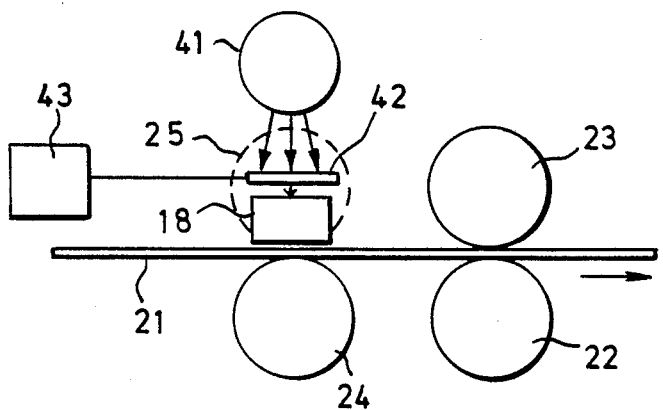
FIG. 5 is similar to FIG. 2 modified by the provision of a selected filter.

The coating of light sensitive material on the mail item may include a mixture of micro capsules containing different inks which are sensitive to different wavelengths of light and which change to different colours after reacting with the developer. Thus by providing multiple print heads respectively controlling light from multiple sources of different wavelengths corresponding to the sensitivities of the inks in the micro capsules, a multi colour print impression may be formed on the mail item. If inks providing the three primary colours are used, three print heads co-operating with three light sources would permit formation of a print impression with a full spectrum of colours. The use of differently coloured inks in the coating would permit printing of the franking in one or more colours and printing of a slogan or other information in one or more colours which may be the same as or different from the colour or colours in which the franking is printed. If desired, instead of providing multiple print heads respectively controlling light from multiple light sources, a single source 41 (FIG. 5) emitting light of all the required wavelengths may be used. Conveniently such a source would emit white light. Filters 42 are selectively positioned between the source 41 and the print head 18 by filter selection means 43 to select light of a desired wavelength to which the coating is to be exposed at any time during the printing operation under control of the print head 18.

Since the print impression formed by a franking machine occupies only a strip along the upper portion of an envelope, the coating of sensitive material is preferably applied only in the area of that strip. The quality of print impression obtainable using a sensitive coating containing micro capsules has a very high resolution and this allows a high degree of detail to be incorporated in the franking impression to prevent copying of the franking impression for fraudulent purposes. The franking impression may even be formed so as to appear to the naked eye as being of one single colour while incorporating a predetermined pattern or code in another colour which is visible only by the use of inspection equipment. This may be used to detect fraudulent or unauthorised franking. Furthermore the high quality of print impression obtainable enables a user of a franking machine to print advertising material on the mail item with great clarity and detail.

The printing process described hereinbefore is not subject to thermodynamics and the speed of printing is not dependent upon the time required to heat printing elements and to dissipate heat from heated elements as is required when utilising thermal printing techniques. Accordingly printing may be effected at higher speed of throughput as compared with thermal transfer printing devices.

When it is desired to carry out a franking operation, the user of the machine enters, by means of the keyboard 14, the value of postal charge. The microprocessor 12 carries out a check to ensure that the credit value held in the memories 13 is sufficient to cover this required value of postal charge and in the event that this check is satisfactory print control signals are passed to the print head driver circuit 19. The mail item 21, such as an envelope, is fed into the feed path in the printer unit 11 with an orientation such that the strip along the upper part of the envelope, which has been coated with sensitive material will pass under the print head 18. The elements in the print head 18 are selectively and successively driven by the driver circuit 19, in synchronism with feeding of the mail item 21 by the feed rollers 24, 22 along the feed path past the print head 18, in such a manner that the desired pattern of printing is obtained on the mail item. Means are provided to sense the feeding of the mail item past the print head firstly to ensure that a mail item is present and secondly to provide signals to synchronise the driving of the print head with the feeding of the mail item.

While the envelope described hereinbefore is treated only on an upper strip, if desired the entire face of the envelope may be treated with sensitive material. Treating of the entire face would permit printing of the destination information by a printer having selectively driven print elements. The printer for printing the destination information may if desired be incorporated in the printing unit 11 of the franking machine.

The envelopes may be formed of paper which has been coated in bulk with sensitive material. Alternatively, particularly where it is desired to coat only a strip of the front face of the envelope, the front faces of the envelopes may be treated after manufacture of the envelopes.

Figure 4:
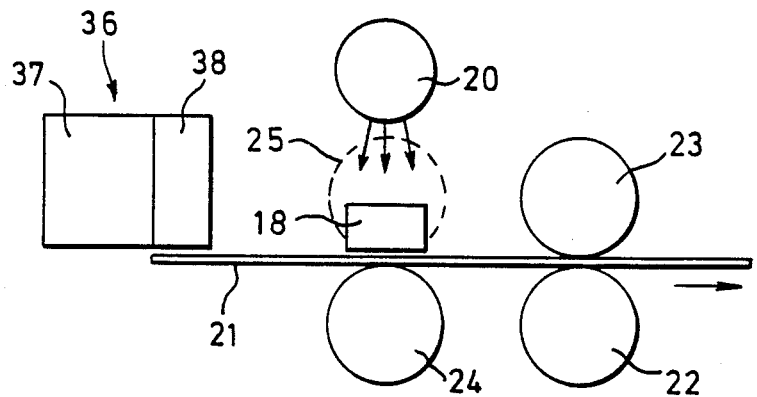
FIG. 4 is similar to FIG. 2 modified by the provision of means to coat a mail item.

Instead of using envelopes which have been pre-treated during manufacture thereof, the franking machine may be provided with means for applying the required coating as part of the printing process. As shown in FIG. 4, a coating station 36 is provided upstream, in relation to the feeding of mail items 21, of the print head 18. The coating station 36 includes a dispenser 37 operative to coat uncoated envelopes fed to the franking machine with a coating comprising micro-capsules and developer and also includes a heater 38 operative to dry the coating applied to the envelopes. The coating may be applied along a narrow strip to the front face of an envelope corresponding to the strip in which a franking impression is to be printed or may be applied along a broader strip corresponding to that in which the franking impression and a destination address are to be printed.

Figure 3:
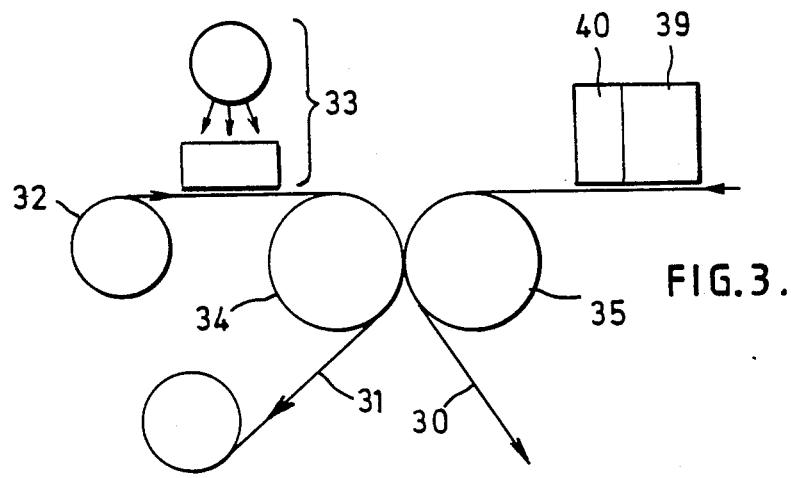
FIG. 3 illustrates an electro photographic print device using a transfer process of printing.

Instead of treating the envelope with a layer of developer and a sensitive coating of micro-capsules, a transfer system may be used as shown in FIG. 3 in which the developer is carried by a label strip 30 and the coating of micro-capsules is carried on a film 31. A supply of un-exposed film is held on a reel 32 and is drawn from the reel as required through an exposure zone in which the coating of micro-capsules is selectively exposed to light from a device 33. The label strip 30 and the film 31 is fed between a pair of pressure rollers 34,35 such as to bring the exposed coating on the film 31 into contact under pressure with the surface of the label strip which has been treated with developer. The exposed micro-capsules are and remain hardened by their exposure to light while the un-exposed micro-capsules rupture under the pressure of contact with the surface of the label strip and thereby the ink in the micro-capsules is released and reacts with the developer in the surface of the label strip. If desired the label strip may be pre-treated with developer or apparatus for applying developer to the strip may be provided on the franking machine. In the latter situation, the strip is fed past means 39 to dispense developer from a reservoir tank containing developer and then past a radiant heater 40 to dry the developer. Alternatively, the developer may be carried as a transfer layer on a further film which is brought into contact with the label strip to transfer the developer to the label strip prior to the label strip being brought into contact with the film 31 carrying exposed micro-capsules. The strip then passes through the zone in which the exposed coated film is brought into contact under pressure with the treated surface of the strip. Alternatively the film 31 may carry a coating comprising micro-capsules and developer which would permit the use of an untreated label strip 30. The exposed coating carried by the film 31 is brought into contact with the surface of the untreated label strip 30 under pressure between the rollers 34, 35 and this causes rupture of the unexposed micro-capsules and reaction thereof with the developer and at the same time the ink is transferred from the film 31 to the surface of the label strip 30.

It will be understood that in the transfer system decribed in relation FIG. 3, the film 31 and the mail item consisting of the label tape 30, or an envelope, are fed together through the nip between rollers 34, 35 without significant slippage between the film and tape or envelope. Means may be operated during intervals between printing of consecutive franking impressions to move one of the rollers 34, 35 away the other roller to allow the tape or envelope to be fed without simultaneously feeding the film 31.

While the invention has been described hereinbefore in relation to printing a franking impression and other information on a mail item consisting either of an envelope or a label strip, it is to be understood that the printing may be effected on either item as desired provided suitable feeding means for feeding the item through the printing device is provided. When printing is effected on envelopes which may differ in thickness due to the contents of the envelope, resilience for example in the mounting of one of the rollers may be provided to accommodate such differences in thickness while at the same time applying a required pressure to cause rupturing of the micro-capsules.

What is claimed:

1. A franking system comprising the combination of a substrate having an area of a face thereof coated with material comprising micro capsules of fluid ink, said ink being changeable from a fluid state to a hard state by exposure to light of predetermined wavelength; and a franking machine including a printing device selectively operable to print a franking impression on a mail item by exposing selected portions of the coating on the face of the substrate to light of said predetermined wavelength and then bringing the exposed coating into contact under pressure with the mail item and into contact with a developer to cause un-exposed micro capsules containing fluid ink to release the fluid ink contained therein to react with the developer and change the visual appearance of the released ink to thereby produce a franking impression on said mail item.

2. A franking system comprising the combination of a mail item such as an envelope or label having an area on a face thereof treated with material comprising micro capsules of fluid ink and a developer for said ink, said ink being changeable from a fluid state to a hard state by exposure to light of predetermined wavelength; and a franking machine including a printing device selectively operable to print a franking impression on said face of the mail item by exposing selected portions of the area on the face of the mail item to light of said predetermined wavelength and then treating the mail item in such manner as to cause only the un-exposed micro capsules containing fluid ink to release the ink to react with said developer and thereby change the visual state of the exposed portions of the area.

3. A franking system as claimed in claim 1 wherein the substrate comprises a film and wherein the developer is carried by a surface of the mail item to receive a franking impression.

4. A franking system as claimed in claim 1 wherein the material contains first and second micro capsules, said first and second micro capsules respectively containing first and second inks sensitive to light of different predetermined wavelengths and having different colours after reacting with the developer and wherein the franking machine includes printing means operable to expose selected portions of the coating of micro-capsules respectively to light of said predetermined wavelengths selectively.

5. A franking system as claimed in claim 4 including a plurality of printing devices, the printing devices respectively including sources operable to produce light of the different predetermined wavelengths.

6. A franking system as claimed in claim 4 including a source operable to emit light of a plurality of the predetermined wavelengths; a plurality of filters transparent to light having different ones of said predetermined wavelengths and means to select one of said filters to thereby select light of a wavelength to which the selected filter is transparent.

7. A franking machine including a printing device comprising elements selectively operable to expose selected portions of an area of a film, coated with material comprising micro-capsules containing ink in a fluid state, to light of predetermined wavelength to cause the ink to harden and remain hard; and means to bring said exposed coating on the film into contact under pressure in the presence of developer with a mail item whereby the unexposed micro-capsules containing ink in a fluid state rupture and release said ink to react with the developer and produce a franking impression on the mail item.

8. A franking machine including a printing device comprising elements selectively operable to expose selected portions of an area of the face of a mail item treated with material sensitive to light of predetermined wavelength whereby subsequent treatment of the sensitive material is effective to produce a colour differential between the exposed selected portions and the remainder of the area treated with sensitive material.

9. A franking machine as claimed in claim 7 wherein the printing device includes a source of light of predetermined wavelength and shutter means disposed and selectively operable to selectively permit or inhibit passage of light from the source to the material comprising micro-capsules containing ink in response to electric drive signals from electronic accounting and control means.

10. A franking machine as claimed in claim 9 wherein the shutter means comprises a plurality of elements individually and selectively operable to permit or inhibit passage of light.

11. A franking machine as claimed in claim 7 wherein the printing device includes one or more sources of light selectively operable to expose selected portions of the material comprising micro-capsules.

12. A franking machine as claimed in claim 7 including a plurality of printing devices, the printing devices respectively including sources operable to produce light of different predetermined wavelengths.

13. A franking machine as claimed in claim 7 including a source of light operative to emit light having a plurality of different wavelengths; a plurality of filters transparent respectively to light of different ones of said wavelengths; and means operable selectively to render a selected one of said filters operative to permit transmission of light of wavelength to which the filter is transparent from said source to the material containing micro-capsules.

14. A franking machine as claimed in claim 9 wherein the shutter means comprises a plurality of elements disposed in a row extending transversely to a direction of feed of a mail item.

15. A franking machine as claimed in claim 9 wherein the shutter means comprises an array of elements selectively operable to permit or inhibit the passage of light from the source.

16. A franking machine as claimed in claim 15 wherein the shutter means includes one or more elements having a shape corresponding to a pattern or part of a pattern to be formed on a mail item.

17. A mail item such as an envelope or label having an area on a face thereof treated with material comprising micro capsules of fluid ink and a developer for said ink, said ink being changeable from a fluid state to a solid state by exposure to light of predetermined wavelength.

18. A mail item as claimed in claim 17 wherein the area of the face of the item is treated with material containing first and second micro capsules, said first and second micro capsules respectively containing first and second inks sensitive to light of different wavelengths and having different colours after reacting with the developer.

* * * * *